(12) United States Patent
Van De Graaff

(10) Patent No.: US 6,728,152 B2
(45) Date of Patent: *Apr. 27, 2004

(54) SENSE AMPLIFIER FOR REDUCTION OF ACCESS DEVICE LEAKAGE

(75) Inventor: Scott Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/369,834

(22) Filed: Feb. 18, 2003

(65) Prior Publication Data

US 2003/0123312 A1 Jul. 3, 2003

Related U.S. Application Data

(63) Continuation of application No. 09/838,820, filed on Apr. 19, 2001, now Pat. No. 6,522,592.

(51) Int. Cl.[7] .................................................. G11C 7/00
(52) U.S. Cl. ...................... 365/205; 365/207; 365/149
(58) Field of Search ............................... 365/205, 207, 365/149

(56) References Cited

U.S. PATENT DOCUMENTS

| 4,141,081 A | 2/1979 | Horne et al. ................. 365/203 |
| 5,091,885 A | 2/1992 | Ohsawa |
| 5,113,372 A | 5/1992 | Johnson ....................... 365/205 |
| 5,220,221 A | 6/1993 | Casper ........................ 307/530 |
| 5,280,205 A | 1/1994 | Green et al. ................. 307/530 |
| 5,608,668 A | 3/1997 | Zagar et al. ................. 365/149 |
| 5,615,158 A | 3/1997 | Ochoa et al. ................. 365/201 |
| 5,694,368 A | 12/1997 | Lim et al. .................... 365/210 |
| 5,726,931 A | 3/1998 | Zagar et al. ................. 365/149 |
| 5,742,549 A | 4/1998 | Ochoa et al. ................. 365/201 |
| 5,790,459 A | 8/1998 | Roohparvar ............. 365/185.21 |
| 5,835,433 A | 11/1998 | Casper ........................ 365/207 |
| 5,870,338 A | 2/1999 | Casper |
| 5,903,502 A | 5/1999 | Porter ......................... 365/201 |
| 5,930,188 A | 7/1999 | Roohparvar ................. 365/201 |
| 5,949,730 A | 9/1999 | Shirley et al. ............... 365/207 |
| 5,959,921 A | 9/1999 | Manning et al. ............ 365/208 |
| 5,986,955 A | 11/1999 | Siek et al. ................... 365/203 |
| 5,991,904 A | 11/1999 | Duesman ..................... 714/720 |
| 6,005,816 A | 12/1999 | Manning et al. ............ 365/208 |
| 6,075,737 A | 6/2000 | Mullarkey et al. .......... 365/207 |
| 6,137,737 A | 10/2000 | Mullarkey et al. .......... 365/201 |
| 6,157,566 A | 12/2000 | Wu et al. .................... 365/175 |
| 6,169,695 B1 | 1/2001 | Duesman ..................... 365/201 |
| 6,266,287 B1 | 7/2001 | Porter ......................... 365/205 |
| 6,269,037 B1 | 7/2001 | Porter ......................... 365/201 |
| 6,278,632 B1 | 8/2001 | Chevallier ............. 365/185.03 |
| 6,292,417 B1 | 9/2001 | Seyyedy ...................... 365/203 |
| 6,345,006 B1 | 2/2002 | Ingalls et al. ............... 365/205 |
| 6,522,592 B2 * | 2/2003 | Van De Graaff ............ 365/205 |
| 2002/0008549 A1 | 1/2002 | Forbes ......................... 327/57 |

\* cited by examiner

*Primary Examiner*—Huan Hoang
(74) *Attorney, Agent, or Firm*—Schwegman, Lundberg, Woessner & Kluth, P.A.

(57) ABSTRACT

A sense amplifier circuit includes first and second amplifier circuits. The first amplifier circuit includes a pair of cross-coupled transistors of a first channel type (e.g., N-channel FETs), and the second amplifier circuit includes a pair of cross-coupled transistors of a second channel type (e.g., P-channel FETs). The sense amplifier circuit also includes a third transistor of the second channel type coupled between first nodes of the first and second amplifier circuits, and a fourth transistor of the second channel type coupled between second nodes of the first and second amplifier circuits. The sense amplifier circuit reduces access device leakage of a DRAM cell during LRL refresh access, and improves refresh margin on a DRAM cell with a one written thereto. A method of reducing access device leakage and improving refresh margin using such an improved sense amplifier is also described.

31 Claims, 11 Drawing Sheets

SENSE AMPLIFIER FOR REDUCTION OF ACCESS DEVICE LEAKAGE

This application is a Continuation of U.S. application Ser. No. 09/838,820, filed Apr. 19, 2001 now U.S. Pat No. 6,522,592, which is incorporated herein by reference.

FIELD OF THE INVENTION

The present invention relates to the field of semiconductor memory devices. More particularly, this invention relates to a memory device which includes a sense amplifier circuit that reduces access device leakage during active refresh.

BACKGROUND OF THE INVENTION

Semiconductor memory devices, such as dynamic random access memory (DRAM) devices, typically store data in an array of memory cells. Each cell in the array stores a single bit of data (i.e., a logic one or zero) as a charge on a capacitor. For example, referring to FIG. 1, a DRAM memory cell or memory bit 100 consists of one MOS transistor 102 and one storage capacitor 104-accordingly referred to as a one-transistor one-capacitor (1T1C) cell. Memory bit transistor 102 operates as a switch, interposed between the memory bit capacitor 104 and a digit or bit line 106. Memory bit 100 is capable of holding a single piece of binary information as stored electric charge in capacitor 104. Given a bias voltage of Vcc/2 on capacitor 104's common node, a logic one level is represented by +Vcc/2 volts across the capacitor, and a logic zero is represented by −Vcc/2 volts across the cell capacitor. Thus, the potential at node 110 typically equals Vcc for logic one, and ground for logic zero.

Digit line 106 consists of a conductive trace or line connected to a multitude of memory bit transistors for a multitude of memory cells in an array. Generally, either metal or silicided/polycided polysilicon forms the conductive line. Due to the large quantity of attached memory bits, its physical length, and its proximity to other features, digit line 106 is very capacitive. For instance, a typical value for digit line capacitance on a 0.35 um process might be around 300 fF. Digit line capacitance is an important parameter since it dictates many other aspects of the memory design.

Memory bit transistor 102's gate terminal connects to a word line (row line) 108. Word line 108, which also connects to a multitude of memory bits or memory cells, consists of an extended segment of the same polysilicon that is used to form the transistor 102's gate. Word line 108 is formed so as to be physically orthogonal to digit line 106. A memory array 200, as in FIG. 2, is created by tiling a selected quantity of memory bits 100 together so that memory bits 100 along a given digit line 106 do not share a common word line 108, and bits 100 along a common word line 108 do not share a common digit line 106. In the layout of FIG. 2, memory bits are paired to share a common contact to the digit line, which reduces the array size.

Referring to FIG. 2, assume that the cell capacitors have logic one levels (+Vcc/2) stored on them. The digit lines D0, D1 . . . DN and D0*, D1* . . . DN* are initially equilibrated at Vcc/2 volts. All word lines WL0, WL1 . . . WLM are initially at 0 volts, which turns off the memory bit transistors. To read memory bit 1, word line WL0 transitions to a voltage that is at least one voltage threshold $V_{th}$ above Vcc. This elevated word line voltage level is referred to as Vccp or Vpp. When the word line voltage exceeds one $V_{th}$ above the digit line voltage (Vcc/2 in this example) and the memory bit transistor turns on, the memory bit capacitor will begin to discharge onto the digit line. Essentially, reading or accessing a DRAM cell results in charge sharing between the memory bit capacitor and the digit line capacitance. This sharing of charge causes the digit line voltage to either increase for a stored logic one or decrease for a stored logic zero. A differential voltage (Vsignal) develops between the two digit lines. The magnitude of this signal voltage Vsignal is a function of the memory bit capacitance (Cmemory_bit), digit line capacitance (Cdigit), the memory bit's stored voltage prior to the access (Vcell), and any noise terms Vnoise. For a design in which Vcell=1.65 V, Cmemory_bit=40 fF, Cdigit=300 fF and Vnoise=0, this yields a digit line change of Vsignal=194 mV. FIG. 3 provides a graph 300 with waveforms for the cell access operation just described.

After the cell access is complete, a sensing operation can commence. The reason for forming a digit line pair will now become apparent. FIG. 4 contains a schematic diagram for a simplified typical sense amplifier circuit 400. Circuit 400 consists of a cross-coupled NMOS transistor pair 402 forming an N-sense amplifier, and a cross-coupled PMOS transistor pair 404 forming a P-sense amplifier. The N-sense-amp common node is labeled NLAT* (for N-sense-amp LATch). Similarly, the P-sense-amp common node is labeled ACT (for ACTive pull-up). As shown in FIG. 5, NLAT* is biased to Vcc/2 volts and ACT is biased to Vss or ground. Since the digit line pair D0 and D0* are both initially at Vcc/2 volts, the N-sense-amp transistors are initially off due to zero Vgs potential. Similarly, both P-sense-amp transistors are initially off due to their positive Vgs potential. As discussed in the preceding paragraph, a signal voltage develops between the digit line pair D0 and D0* when the memory bit access occurs. While one digit line (D0) contains charge from the cell access, the other digit line (D0*) serves as a reference for the sensing operation. The sense amplifier firing generally occurs sequentially rather than concurrently. The N-sense-amp fires first and the P-sense-amp fires second. The N-sense amplifier is generally a better amplifier than the P-sense-amp because of the higher drive of NMOS transistors, and better $V_{th}$ matching. This provides for better sensing characteristics and lower probability of errors. Dropping the NLAT* signal toward ground will fire the N-sense-amp. As the voltage between NLAT* and the digit line approaches $V_{th}$, the N-sense-amp transistor whose gate connection is to the higher voltage digit line will begin to conduct first. This conduction results in the discharge of the low voltage digit line toward the NLAT* voltage. Ultimately, the NLAT* voltage will reach ground, bringing the low voltage digit line with it. The other NMOS transistor of the N-sense-amp will not conduct since its gate voltage derives from the low voltage digit line, which is being discharged toward ground.

Shortly after the N-sense-amp fires, ACT will be driven toward Vcc volts. This activates the P-sense-amp that operates in a complementary fashion to the N-sense-amp. With the low voltage digit line approaching ground, a strong signal will exist to drive the appropriate PMOS transistor into conduction. This will charge the high voltage digit line toward ACT, ultimately reaching Vcc. Since the memory bit transistor 102 remains on during sensing, the memory bit capacitor 104 is charged to the NLAT* voltage level (for a stored logic zero) or the ACT voltage level (for a stored logic one). Thus, the voltage, and hence the charge, which the memory bit capacitor held prior to accessing will be restored to a full level. In other words, capacitor 104 will be charged to Vcc for logic one and ground for logic zero. This restoration of the charge on capacitor 104 can be referred to as a refresh operation.

For a memory write operation, the paired digit lines are charged to represent the data to be written into the memory cell. Referring back to FIG. 1, the word line 108 is activated to turn on the memory bit transistor 102 to connect the digit line 106 to the memory cell capacitor 104, thereby allowing write data on D0/D0* to charge the cell capacitor. It will be appreciated that the memory read/write operations have been described herein in a simplified manner and that such access operations include numerous additional steps known to those skilled in the art.

As illustrated by FIG. 5, when the memory bit being accessed stores a logic one, the low voltage digit line D0* will be discharged toward the NLAT* voltage during a sensing operation. Similarly, when the memory bit being accessed stores a logic zero, the low voltage digit line D0 will be discharged toward NLAT*. Thus, in either case, the refresh operation will result in the low voltage digit line being discharged toward ground. Therefore, the "zero" seen on the low voltage digit line during the refresh access will have a potential of zero (i.e., ground potential). Such a memory refresh access may be referred to in the art as a LRL or active refresh access.

Unfortunately, allowing the "zero" seen on the low voltage digit line during a refresh access to be discharged all the way down to ground results in a relatively large access device leakage on all cells not being accessed but sharing the grounded digit, and adversely effects refresh margin on a DRAM cell with a one written thereto. Therefore, what is needed is an improved method and apparatus for reducing access device leakage of a DRAM memory cell during a LRL refresh access, and for improving refresh margin on a DRAM cell with a one written thereto. There is further a need for an improved sense amplifier for use in a DRAM memory circuit that reduces access device leakage, and improves refresh margin on a memory cell with a one written thereto. Preferably, such an improved sense amplifier would provide these advantages without adversely affecting its lock.

SUMMARY OF THE INVENTION

In accordance with one aspect of the invention, a sense amplifier circuit includes a first amplifier circuit and a second amplifier circuit, each having a first node and a second node. The first amplifier circuit includes a pair of cross-coupled transistors of a first channel type, and the second amplifier circuit includes a pair of cross-coupled transistors of a second channel type. The sense amplifier circuit also includes a third transistor of the second channel type coupled between the first node of the first amplifier circuit and the first node of the second amplifier circuit, and a fourth transistor of the second channel type coupled between the second node of the first amplifier circuit and the second node of the second amplifier circuit.

In accordance with another aspect of the present invention, a sense amplifier circuit includes an N-sense amplifier circuit and a P-sense amplifier circuit, each of which has first and second nodes, a first P-channel transistor coupled between the first node of the N-sense amplifier circuit and the first node of the P-sense amplifier circuit, and a second P-channel transistor coupled between the second node of the N-sense amplifier circuit and the second node of the P-sense amplifier circuit.

These and various other features as well as advantages which characterize the present invention will be apparent to a person of ordinary skill in the art upon reading the following detailed description and reviewing the associated drawings.

DESCRIPTION OF THE PREFERRED EMBODIMENTS

Figure 1:
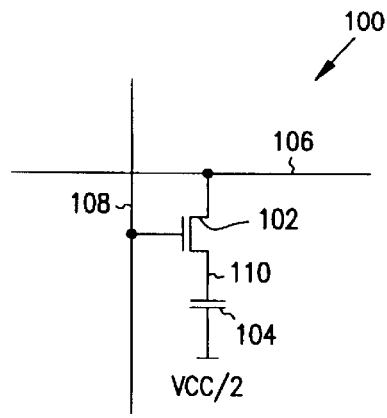
FIG. 1 is a schematic diagram of a cell of a conventional memory circuit.
Figure 2:
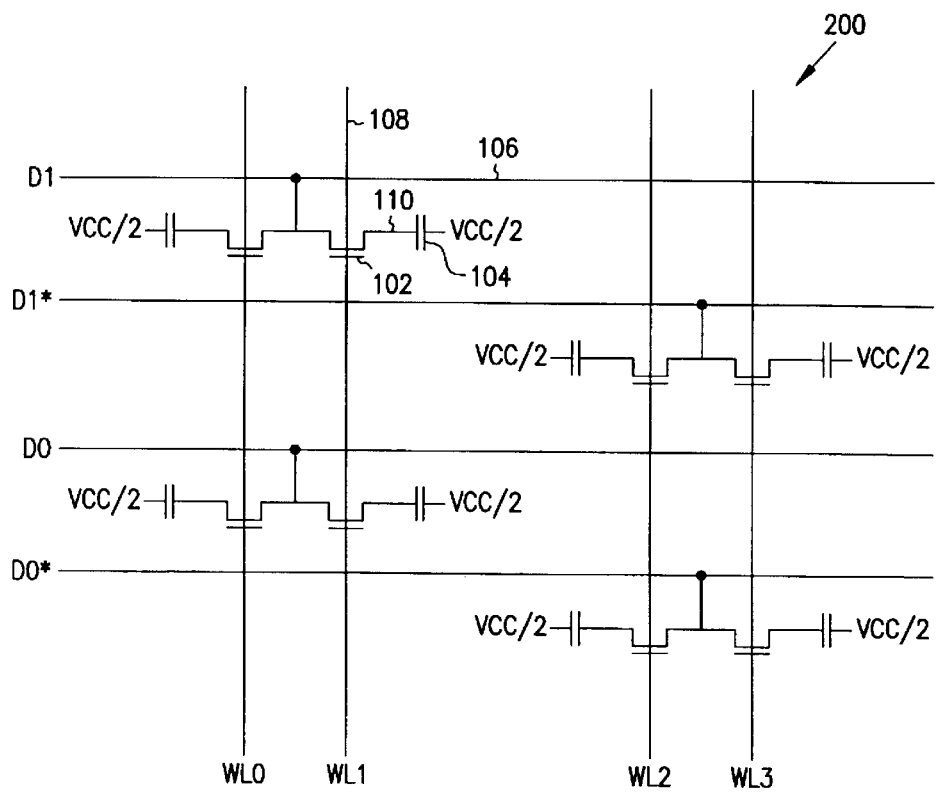
FIG. 2 is a schematic diagram of a conventional memory array including a plurality of memory cells, each memory cell having the structure shown in FIG. 1.
Figure 3:
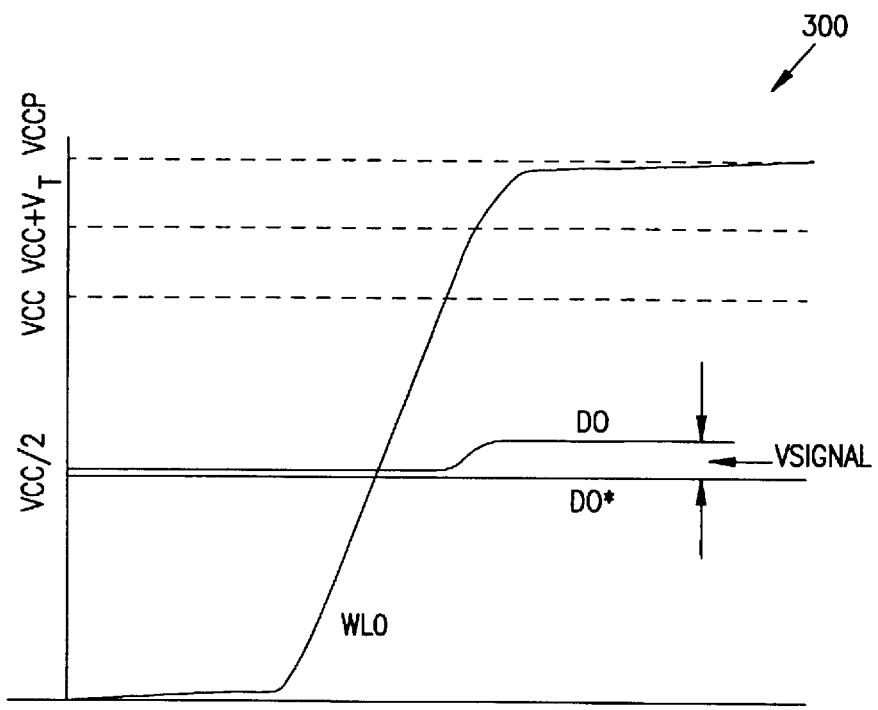
FIG. 3 is a graph illustrating typical waveforms for accessing a memory cell of the conventional memory array shown in FIG. 2 (e.g., during a read operation)
Figure 4:
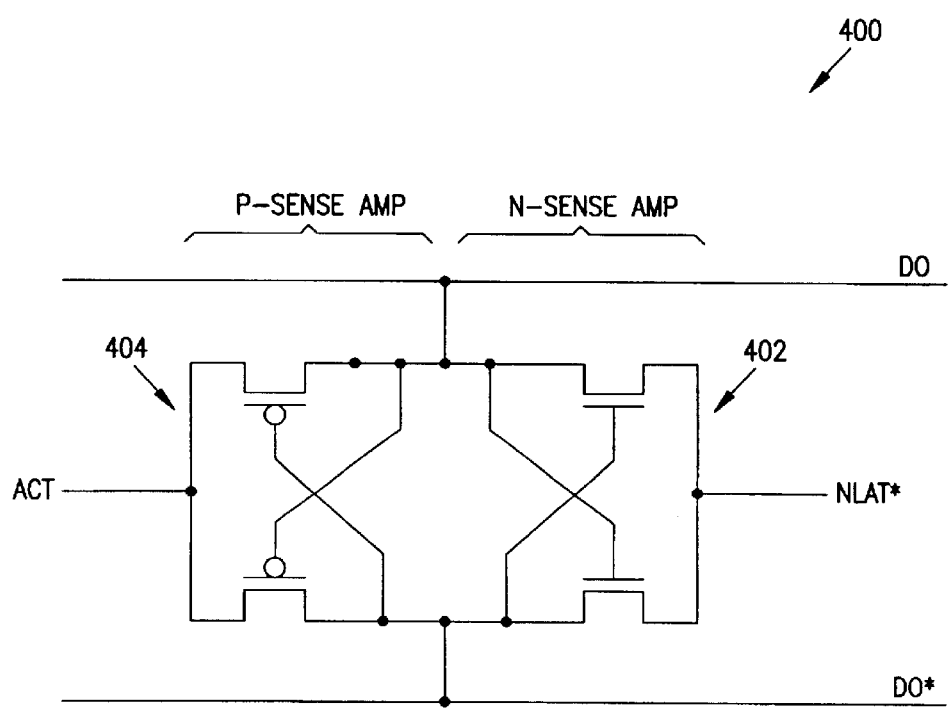
FIG. 4 is a schematic diagram of a conventional sense amplifier.
Figure 5:
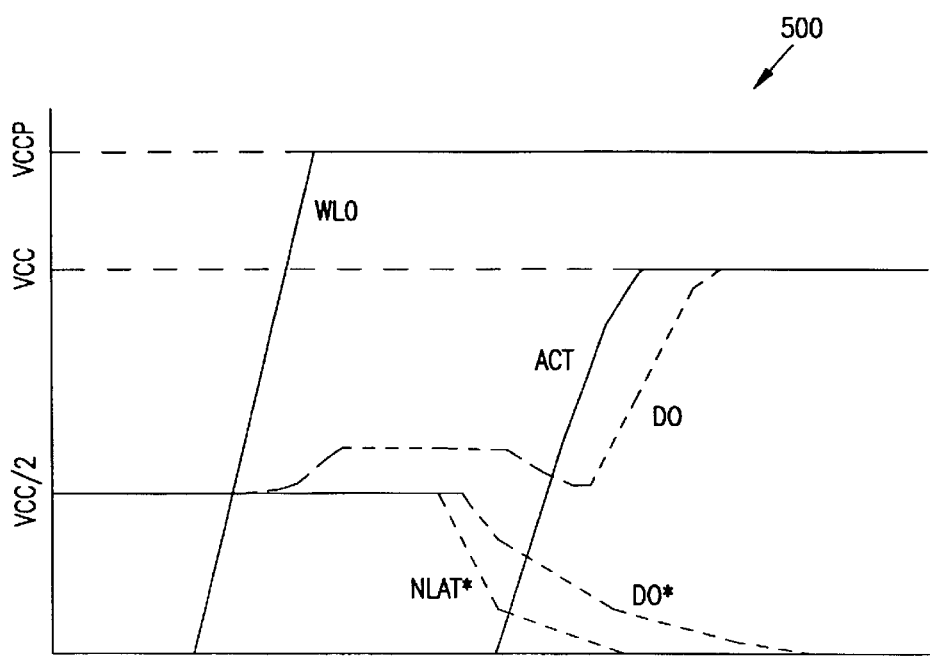
FIG. 5 is a graph illustrating typical waveforms for a sensing operation using the conventional sense amplifier shown in FIG. 4.

In the following detailed description, reference is made to the accompanying drawings, which form a part hereof, and in which is shown, by way of illustration, specific embodiments in which the invention may be practiced. In the drawings, like numerals refer to like components throughout the views. These embodiments are described in sufficient detail to enable those skilled in the art to practice the invention, and it is to be understood that the embodiments may be combined, or that other embodiments may be utilized and that structural, logical and electrical changes may be made without departing from the spirit and the scope of the invention. The following detailed description is, therefore, not to be taken in a limiting sense, and the scope of the invention is defined by the appended claims and their equivalents.

Figure 6:
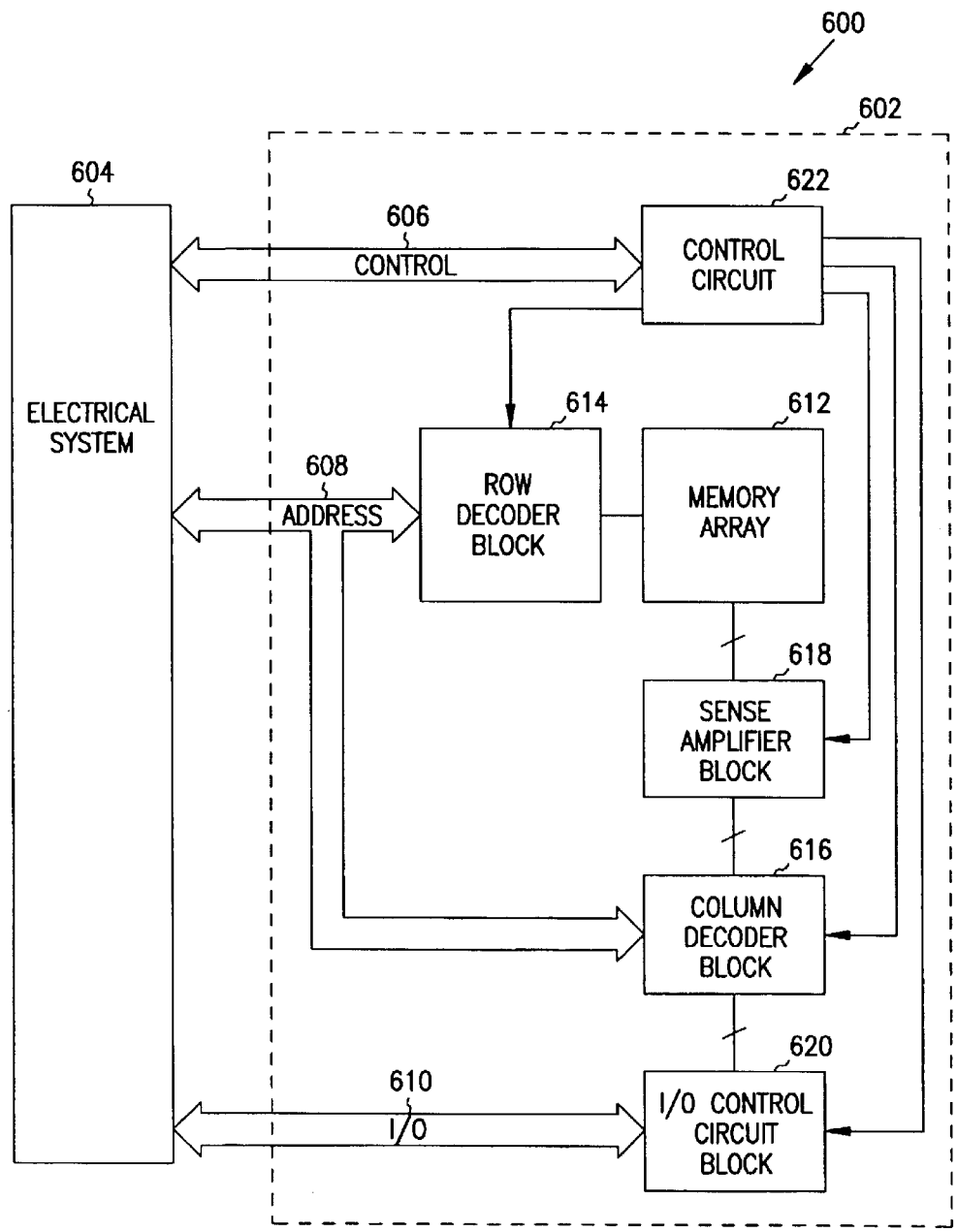
FIG. 6 is a block diagram illustrating a memory circuit in accordance with one embodiment of the present invention.

Referring to FIG. 6, an exemplary system 600 includes a memory circuit or device 602 in accordance with one embodiment of the present invention. Memory device 602 is coupled to an electrical system 604 by a plurality of control lines 606, a plurality of address lines 608, and a plurality of input/output (I/O) lines 610. By using lines 606, 608 and 610, electrical system 604 can write data to memory device 602, and can also read data from memory device 602. Memory device 602 includes a memory array 612, a row decoder block 614 coupled between address lines 608 and memory array 612, a column decoder block 616 coupled to address lines 608, a sense amplifier block 618 coupled between column decoder block 616 and memory array 612, an I/O control circuit block 620 coupled to I/O lines 610 and column decoder block 616, and a control circuit 622 coupled to row decoder block 614, column decoder block 616, sense amplifier block 618, and I/O control circuit 620.

Memory array 612 includes multiple rows of word (row) lines and multiple columns of bit (digit) lines. The intersections of the multiple rows of word lines and the multiple columns of bit lines serve as the locations for multiple memory cells. In one embodiment, memory array 612 forms a dynamic random access memory (DRAM) array. Further, in one embodiment, the memory cells of array 612 use a memory cell layout architecture of eight square features ($8F^2$). In an alternative embodiment, the memory cells use a layout architecture of six square features ($6F^2$). One of skill in the art will appreciate that other layout architectures are also suited for use with the invention; those presented here are not intended to be limiting.

Row decoder block 614 decodes the address signals provided by electrical system 604 on address lines 608 to generate a plurality of word (row) lines, which are applied to memory array 612 to access the memory cells of memory array 612. Similarly, column decoder block 616 decodes address signals provided on address lines 608 to select the bit (digit) lines that are being accessed. In one embodiment, memory device 602 uses multiplexed row and column addresses. The selected bit (digit) lines are used by sense amplifier block 618 to access the columns of memory cells in memory array 612. I/O control circuit block 620 and control circuit 622 provide control signals for controlling various operations of memory device 602.

Figure 7:
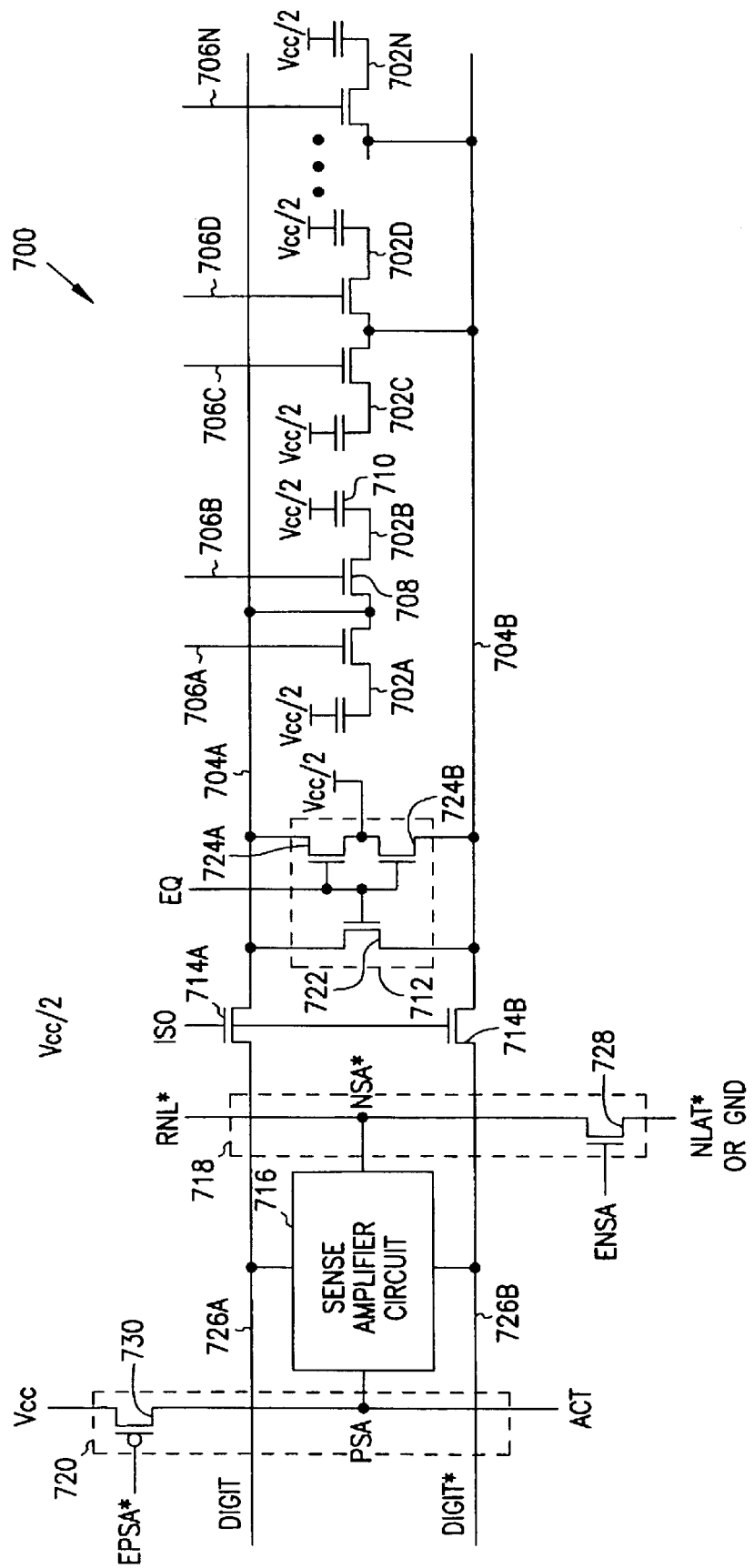
FIG. 7 is a schematic diagram illustrating in more detail a portion of the memory circuit shown in FIG. 6.

Referring now to FIG. 7, a schematic diagram 700 illustrates in more detail a portion of memory circuit 602 (FIG. 6), including portions of memory array 612 and sense amplifier block 618. The illustrated portions of array 612 include a plurality of memory cells 702A . . . 702N, which are coupled to a pair of complementary digit or bit lines 704A and 704B and to a plurality of word lines 706A . . . 706N. Each cell 702A . . . 702N includes a memory bit transistor 708 and a memory bit capacitor 710 (labeled for cell 702B only in FIG. 7). Hence, the memory cells can be referred to as one-transistor one-capacitor (1T1C) cells. Cells 702A . . . 702N are located at the intersections of digit lines 704A and 704B, and word lines 706A . . . 706N. For each cell, memory bit transistor 708 has a gate coupled to the respective word line 706A . . . 706N, a first source/drain coupled to the respective digit line 704A or 704B, and a second source/drain coupled to a first node of the respective cell capacitor 710. The other node of the cell capacitor 710 is coupled to a bias voltage (e.g., Vcc/2 volts). For each memory cell, a logic one is represented by +Vcc/2 across the respective capacitor 710, and a logic zero is represented by −Vcc/2 across the capacitor 710.

The illustrated portions of sense amplifier block 618 include an equilibration and bias circuit 712, a pair of isolation transistors 714A and 714B, a sense amplifier circuit 716, an N-sense firing circuit 718, and a P-sense firing circuit 720.

Equilibration and bias circuit 712 operates to provide the same voltage on the pair of digit lines 704A and 704B, which form a column pair, before starting a cell access and sensing operation. Circuit 712 includes an equilibration transistor 722 coupled between digit lines 704A and 704B, and two bias transistors 724A and 724B coupled between digit lines 704A and 704B, and Vcc/2. The gate of transistors 722, 724A and 724B are each coupled to an equilibrate control signal EQ. EQ is held to Vcc volts whenever memory device 602 is in an inactive or precharge state. During this time, the complementary pair of digit lines 704A and 704B are shorted together through equilibrate transistor 712, and are provided a bias level of Vcc/2 by transistors 724A and 724B. Then, just prior to any word line firing, EQ transitions low to turn off the equilibration and bias transistors 722, 724A and 724B, such that digit lines 704A and 704B are made available for accessing the memory cell. In one embodiment, equilibration and bias transistors 722, 724A and 724B are all NMOS transistors sized large enough to ensure rapid equilibration of the digit lines, and to ensure bias of the digit lines to Vcc/2, to prepare for a subsequent access. Thus, equilibration and bias circuit 712 operates to eliminate adverse effects on the signal voltage that may otherwise be due to offset voltage on digit lines 704A and 704B.

Isolation transistors 714A and 714B are coupled between digit lines 704A and 704B and a complementary pair of digit lines 726A and 726B, respectively, that serve as the DIGIT and DIGIT* input signals for sense amplifier circuit 716. By providing resistance between sense amplifier circuit 716 and digit lines 704A and 704B, isolation transistors 714A and 714B operate to stabilize the sense amplifier and to speed up sensing operations by providing a degree of isolation between the highly-capacitive digit lines 704A and 704B and the low-capacitance sense nodes. In one embodiment, isolation transistors 714A and 714B also operate to isolate array sections to allow a single sense amplifier to serve two adjacent array sections.

N-sense firing circuit 718 includes an enable N-sense amplifier (ENSA) transistor 728 that couples an N-sense amplifier latch signal (e.g., NLAT* or ground) to an N-sense amplifier bus line (RNL*) under the control of an ENSA signal that is applied to its gate. RNL* serves as N-sense-amp firing control signal NSA* for sense amplifier circuit 716. Similarly, P-sense firing circuit 720 includes an enable P-sense amplifier (EPSA) transistor 730 that couples a P-sense amplifier active pull-up signal (ACT) to the P-sense-amp firing control signal (PSA) for sense amplifier circuit 716 under the control of an EPSA* signal applied to its gate. In this embodiment, ACT and PSA are the same node.

Figure 8:
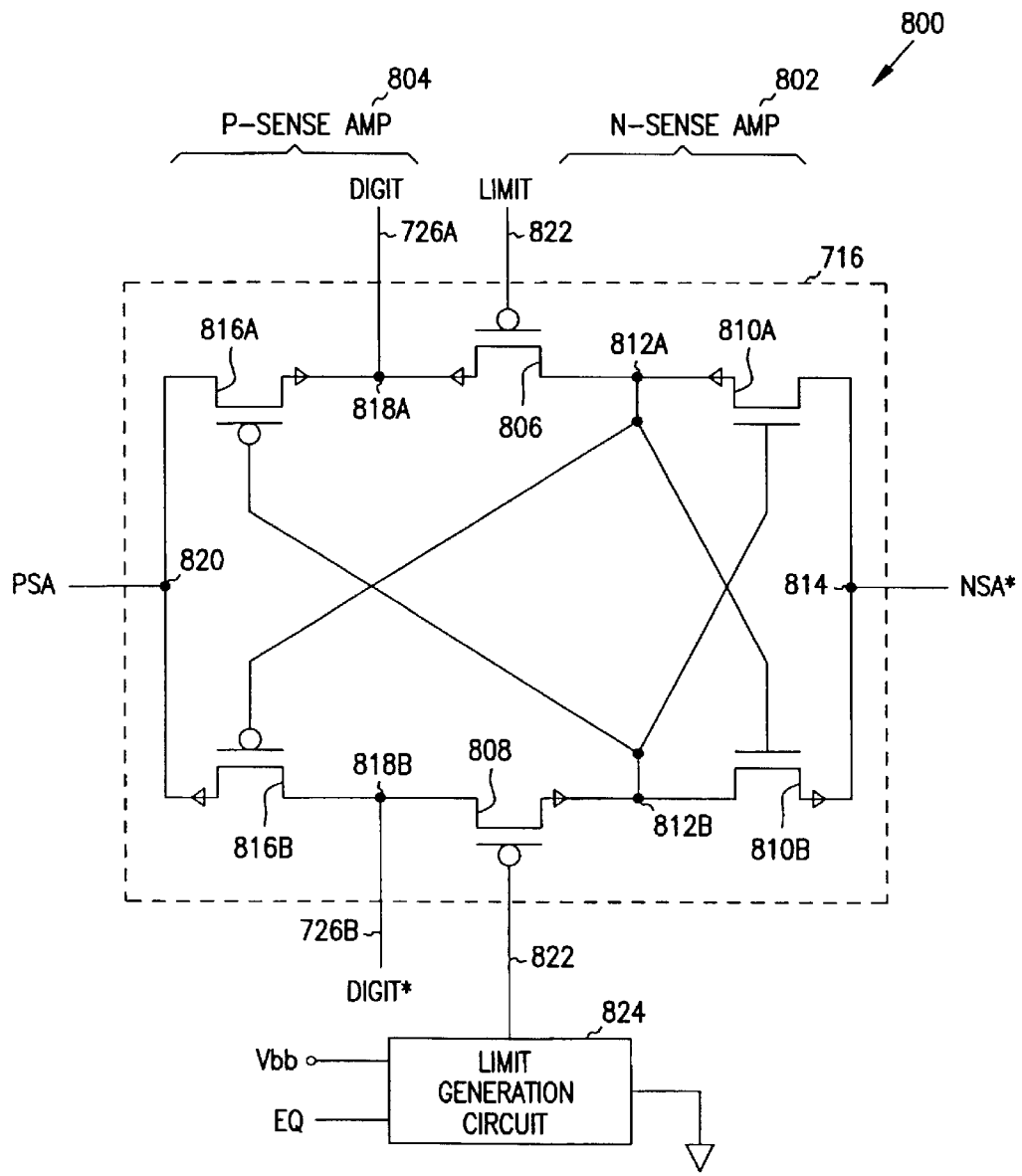
FIG. 8 is a schematic diagram of the sense amplifier of FIG. 7.

Referring to FIG. 8, a schematic diagram 800 illustrates sense amplifier circuit 716 in detail. Circuit 716 includes an N-sense amplifier circuit 802, a P-sense amplifier circuit 804, a P-channel transistor 806, and a P-channel transistor 808.

N-sense amplifier circuit 802 comprises a pair of N-channel transistors 810A and 810B. N-channel transistors 810A and 810B are cross-coupled, with the gate node of transistor 810A coupled to a first source/drain node of transistor 810B, and the gate node of transistor 810B coupled to a first source/drain node of transistor 810A. The first source/drain node of transistor 810A and first source/drain node of transistor 810B define a first node 812A and a second node 812B of circuit 802. A second source/drain node of transistor 810A is coupled to a second source/drain node of transistor 810B to form a common node 814 for circuit 802. The common node 814 receives the NSA* signal generated by N-sense firing circuit 718 (FIG. 7).

P-sense amplifier circuit 804 comprises a pair of P-channel transistors 816A and 816B. P-channel transistors 816A and 816B are cross-coupled, with the gate node of transistor 816A coupled to second node 812B of N-sense amplifier circuit 802, and the gate node of transistor 816B coupled to first node 812A of N-sense amplifier circuit 802. A first source/drain node of transistor 816A and a first source/drain node of transistor 816B define a first node 818A and a second node 818B of P-sense amplifier circuit 804. The first and second nodes 818A and 818B of the P-sense amplifier circuit 804 are coupled to the pair of complementary digit lines DIGIT and DIGIT* via lines 726A and 726B (FIGS. 7 and 8). A second source/drain node of transistor 816A is coupled to a second source/drain node of transistor 816B to form a common node 820 for P-sense amplifier circuit 804. The common node 820 receives the PSA signal that is generated by P-sense firing circuit 720 (FIG. 7).

P-channel transistor 806 includes a first source/drain node coupled to first node 812A of N-sense amplifier circuit 802, a second source/drain node coupled to first node 818A of P-sense amplifier circuit 804, and a gate node coupled to a limit signal (LIMIT) via a line 822. Similarly, P-channel transistor 808 includes a first source/drain node coupled to second node 812B of N-sense amplifier circuit 802, a second source/drain node coupled to second node 818B of P-sense amplifier circuit 804, and a gate node which is also coupled to limit signal (LIMIT) via line 822.

The LIMIT signal on line 822 is generated by a limit generation circuit 824. During access and sense operations, circuit 824 holds the LIMIT signal at ground to pass a P-channel voltage threshold $V_{th}$ to the low voltage digit line, as described in relation to FIG. 9. The P-channel voltage threshold $V_{th}$ limits the "zero" that is seen on the low voltage digit line during an LRL refresh access to a voltage greater than zero. By limiting the zero to a voltage greater than zero, refresh margin on a DRAM cell with a one written thereto is improved by reducing access device leakage. At equilibrate time (which, in one embodiment, is indicated by the EQ signal shown in FIG. 8), limit generation circuit 824 drives the LIMIT signal to a negative substrate bias voltage Vbb. In one embodiment, voltage Vbb is generated by a Vbb pump. By driving the LIMIT signal to Vbb during equilibrate, the low voltage digit line is driven to NSA* rather than the one P-channel $V_{th}$ to allow for a balanced equilibrate.

Figure 9:
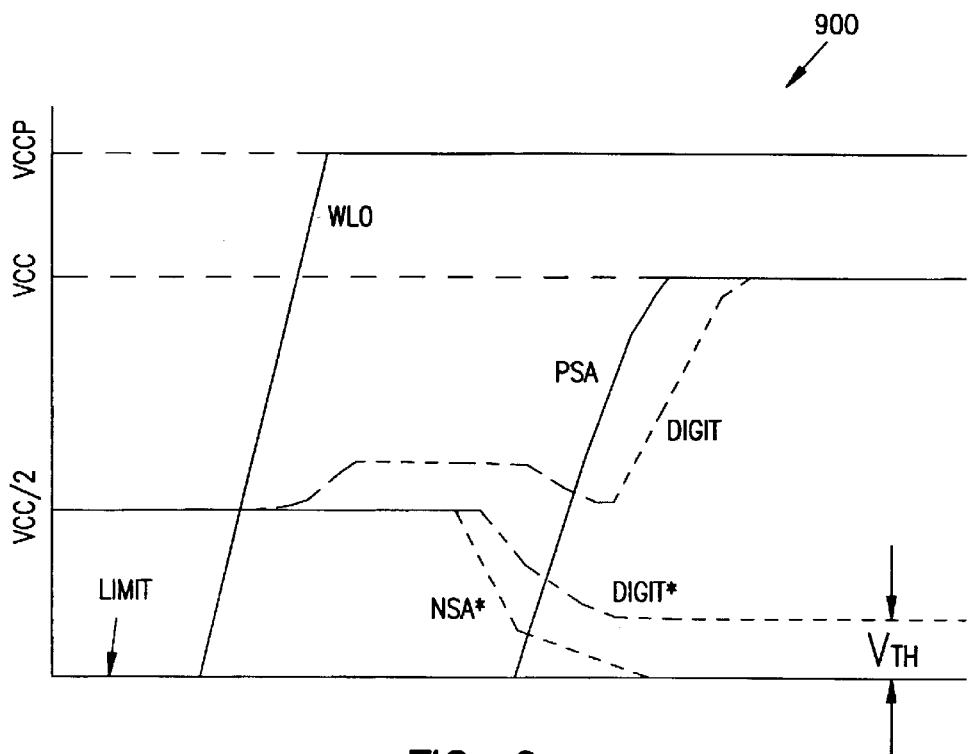
FIG. 9 is a graph illustrating typical waveforms for a sensing operation using the sense amplifier shown in FIG. 8.

Referring to FIG. 9, operation of sense amplifier circuit 716 during an access and sense operation on a memory cell is described in relation to a graph 900. Shown in graph 900 are waveforms including the word line signal WL0 for the cell, the pair of complementary digit lines DIGIT and DIGIT*, the NSA* signal from the N-sense firing circuit, the PSA signal from the P-sense firing circuit, and the LIMIT signal. The LIMIT signal is held at ground during the access and sense operation. In the exemplary operation of FIG. 9, it is assumed that the memory cell stores a logic one.

Initially, the NSA* signal is biased to Vcc/2, and the PSA signal is biased to Vss or signal ground. The digit line pair DIGIT and DIGIT* are equilibrated and are biased to Vcc/2. As a result, both N-sense amplifier transistors 810A and 810B are off. Similarly, both P-sense amplifier transistors 816A and 816B are off. Since the LIMIT signal is held at ground, both P-channel transistors 806 and 808 are on. Since the word line WL0 for the memory cell is initially at 0 volts, the cell transistor 708 is off, and the cell capacitor 710 does not share its charge with the DIGIT line.

Then, the word line WL0 (i.e., one of lines 706A . . . 706N) for the memory cell being accessed is fired. When the word line WL0 reaches a voltage at least one voltage threshold $V_{th}$ above Vcc, the memory cell transistor 708 turns on, and the memory cell capacitor 710 begins to discharge onto the digit line DIGIT. Since the cell is assumed to be storing a logic one, the voltage initially applied to the digit line by the cell capacitor is Vcc. The charge sharing between the memory cell capacitor and the digit line causes the DIGIT line voltage to increase. (If, on the other hand, the memory cell were storing a logic zero, the DIGIT line voltage would decrease.) The increase in the DIGIT line voltage above the bias voltage causes a differential voltage signal to be developed across the pair of complementary digit lines. Thus, while one of the digit lines shares charge with the memory cell being accessed, the other digit line does not-and thereby serves as a reference for the sensing operation.

In one embodiment, after the cell access is complete, the N-sense amplifier circuit 802 and P-sense amplifier circuit 804 are fired sequentially, with the N-sense amplifier circuit being fired before the P-sense amplifier circuit. The higher drive of NMOS transistors, and better $V_{th}$ matching, provide better sensing characteristics by N-sense amplifiers and lower probability of errors, compared to P-sense amplifiers. At this point, the voltages at first and second nodes 812A and 812B of the N-sense amplifier circuit follow the voltages of the DIGIT and DIGIT* lines, respectively, since both of the first and second P-channel transistors 806 and 808 are still on.

As shown in FIG. 9, N-sense amplifier circuit 802 is fired by bringing NSA* from Vcc/2 toward ground. As the voltage difference between NSA* and the digit lines approaches $V_{th}$, the transistor 810A or 8101B in the cross-coupled NMOS pair whose gate is connected to the higher voltage digit line begins to conduct. This conduction occurs first in the subthreshold region and then in the saturation region as the gate-to-source voltage exceeds $V_{th}$. In this example, since DIGIT is the higher voltage digit line, NMOS transistor 810B begins to conduct. The conduction causes the low voltage digit line (i.e., DIGIT*, in this example) and the second node 812B of N-sense amplifier circuit 802 to be discharged toward the NSA* voltage, which is being brought toward ground. Ultimately, NSA* will reach ground, and the second node 812B of N-sense amplifier circuit 802 will be brought to ground potential. The other NMOS transistor 810A, however, does not conduct since its gate is driven by second node 812B of circuit 802, which is being discharged toward ground. In reality, parasitic coupling between digit lines and limited subthreshold conduction by the second transistor results in some conduction in voltage on the high digit line.

As the voltage difference between the LIMIT signal (which is being held at ground potential) and the NSA* signal reaches the P-channel threshold voltage $V_{th}$ of transistor 808, however, P-channel transistor 808 will turn off. Thus, a P-channel threshold voltage $V_{th}$ is passed to low voltage digit line DIGIT*, thereby limiting the "zero" seen on the low voltage digit line DIGIT* to something greater than zero (i.e., to NSA*, which is brought to ground, plus a P-channel voltage threshold $V_{th}$). The effect on the low voltage digit line DIGIT* is illustrated in FIG. 9, which shows that the DIGIT* line decreases with NSA* until reaching a minimum voltage of $V_{th}$.

Some time after N-sense amplifier circuit 802 fires, PSA is brought toward Vcc to fire P-sense amplifier circuit 804, which operates in a complementary fashion to the N-sense amplifier. With second node 812B of N-sense amplifier circuit 802 approaching ground, there is a strong signal to drive the appropriate PMOS transistor (816A, in this example) in the cross-coupled PMOS pair into conduction. This conduction, again moving from subthreshold to saturation, charges the high-voltage digit line DIGIT toward PSA, ultimately reaching Vcc. Note that P-channel transistor 806 remains on, such that first node 812A of N-sense amplifier circuit 802 continues to follow the high-voltage digit line DIGIT. Because the memory cell transistor 708 remains on, the memory cell capacitor 710 is refreshed during the sensing operation. The voltage, and hence charge, which the memory cell capacitor held prior to being accessed is restored to a full level (e.g., to Vcc in this example).

Thus, as shown in FIG. 9, the "zero" that is seen on the low-voltage digit line during an LRL refresh access is limited to something greater than zero volts (e.g., to NSA*, which is brought to ground, plus a P-channel voltage threshold $V_{th}$). At the same time, sense amplifier circuit 716 is allowed to keep its lock (without adverse effect due to P-channel transistors 806 and 808) since the gates of the P- and N-channel transistors of the sense amplifier circuits 802 and 804 remain at CMOS levels (i.e., since the cross-coupled gate connections are all made between N-sense amplifier circuit 802 and the pair of P-channel transistors 806 and 808). By limiting the "zero" seen on the low-voltage digit line, access device leakage can be reduced on a memory cell sharing the low digit but with its word line off, thereby improving refresh margin on a DRAM cell with a one written thereto.

Figure 10:
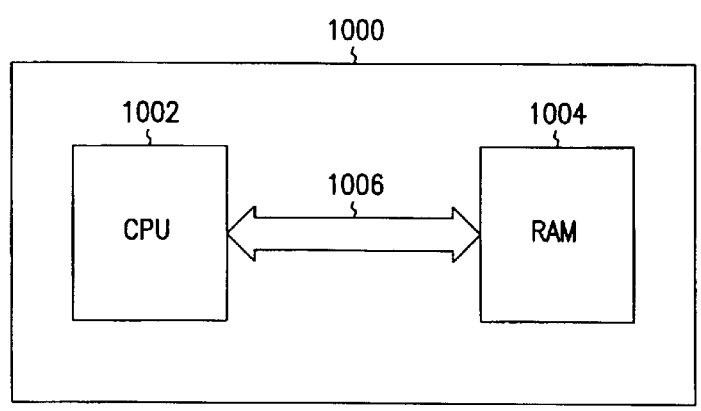
FIG. 10 is a block diagram illustrating an electronic system in accordance with an embodiment of the present invention.

Referring to FIG. 10, an electronic system 1000 in accordance with one embodiment of the present invention includes a central processing unit (CPU) 1002 which is communicatively coupled to a memory device 1004 via a system bus 1006. Memory device 1004 includes memory circuit 602, presented and described above in relation to FIG. 6, and which includes one or more sense amplifiers in accordance with an embodiment of the present invention. In other embodiments, CPU 1002 is communicatively coupled to a plurality of memory devices 1004 via bus 1006.

Figure 11:
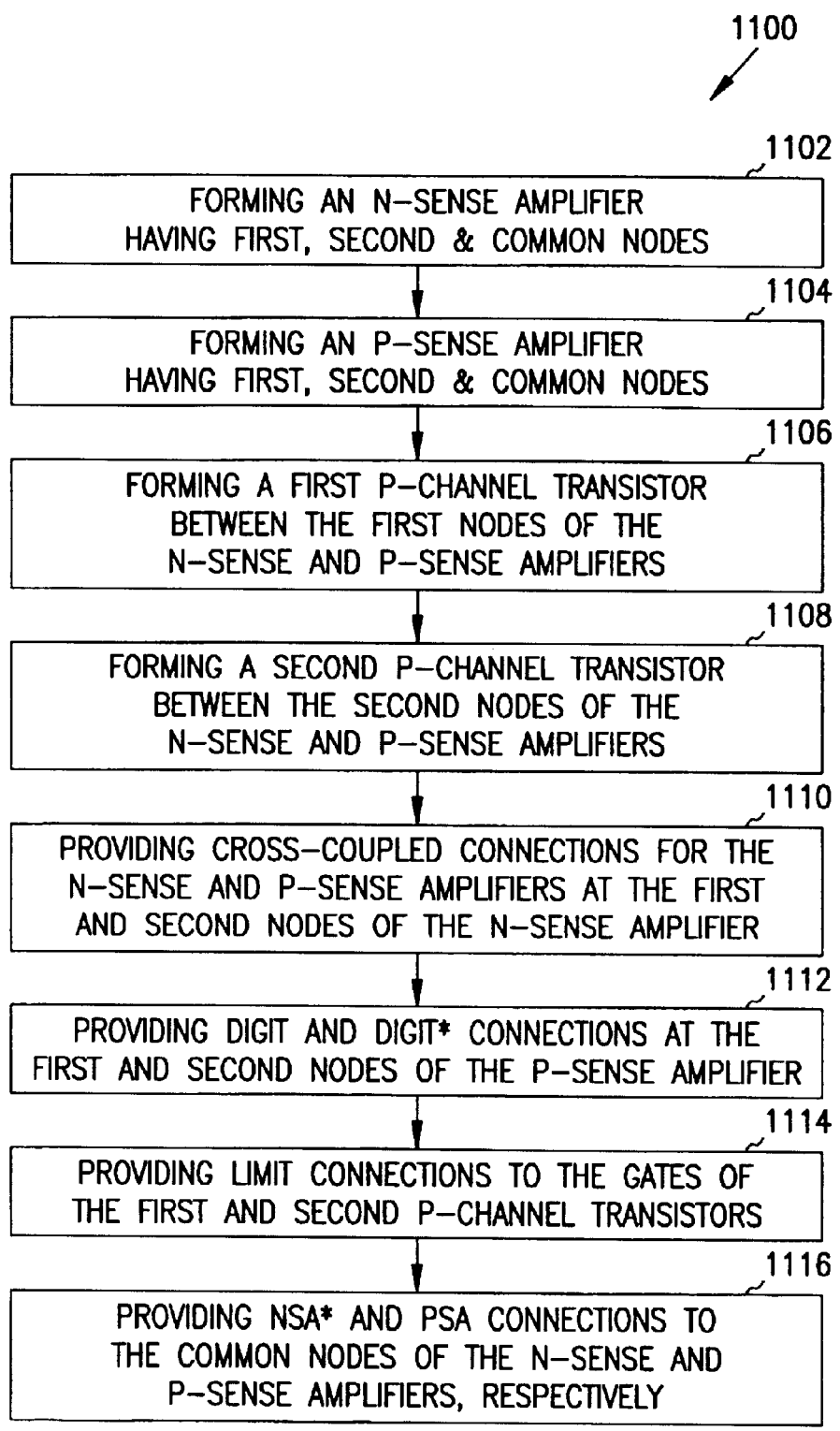
FIG. 11 is a flow diagram illustrating a method of forming a sense amplifier in accordance with an embodiment of the present invention.

A method 1100 for forming a sense amplifier circuit in accordance with an embodiment of the present invention will be understood with reference to FIG. 11. Method 1100 includes forming an N-sense amplifier having first, second and common nodes at 1102, forming a P-sense amplifier having first, second and common nodes at 1104, forming a first P-channel transistor between the first nodes of the N-sense and P-sense sense amplifiers at 1106, and forming a second P-channel transistor between the second nodes of the N-sense and P-sense amplifiers at 1108. The N-sense amplifier may have the form, for example, of N-sense amplifier 802 (FIG. 8), with the first, second and common nodes being at nodes 812A, 812B and 814, respectively. The P-sense amplifier may have the form, for example, of P-sense amplifier 804, with the first, second and common nodes being at nodes 818A, 818B and 820, respectively. The first P-channel transistor may have the form, for example, of P-channel transistor 806, with a first source/drain region coupled to node 812A of N-sense amplifier 802, and a second source/drain region coupled to node 818A of P-sense amplifier 804. The second P-channel transistor may have the form, for example, of P-channel transistor 808, with a first source/drain region coupled to node 812B of N-sense amplifier 802, and a second source/drain region coupled to node 818B of P-sense amplifier 804.

Method 1100 also includes providing cross-coupled connections for the N-sense and P-sense amplifiers at the first and second nodes of the N-sense amplifier at 1110, providing DIGIT and DIGIT* connections at the first and second nodes of the P-sense amplifier at 1112, providing LIMIT connections to the gates of the first and second P-channel transistors at 1114 and providing NSA* and PSA connections to the common nodes of the N-sense and P-sense amplifiers, respectively, at 1116. In one embodiment, the cross-coupled, DIGIT, DIGIT*, LIMIT, NSA* and PSA connections may be provided as illustrated in FIG. 8.

Figure 12:
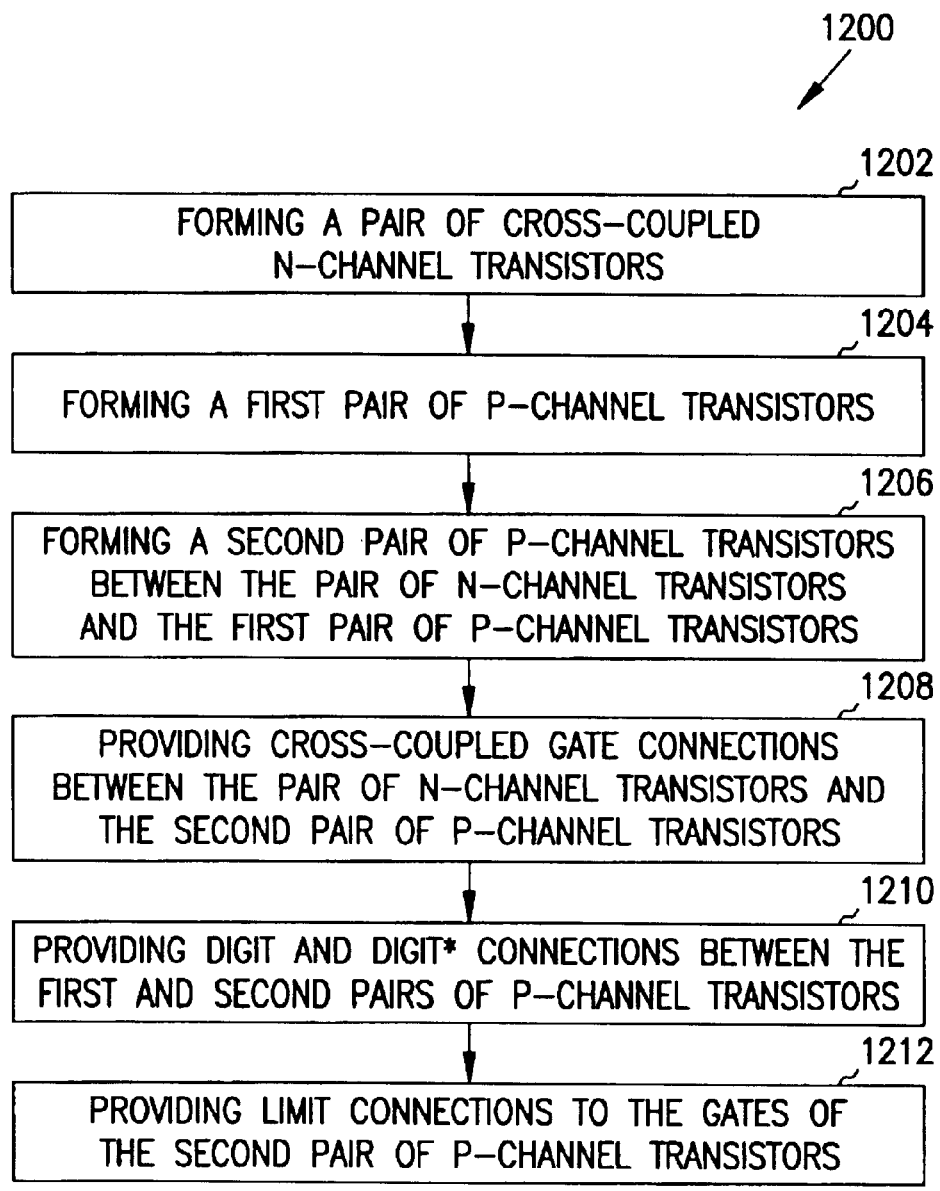
FIG. 12 is a flow diagram illustrating a method of forming a sense amplifier in accordance with another embodiment of the present invention.

Referring to FIG. 12, a method 1200 for forming a sense amplifier circuit in accordance with another embodiment of the present invention includes forming a pair of cross-coupled N-channel transistors at 1202, forming a first pair of P-channel transistors at 1204, forming a second pair of P-channel transistors between the pair of N-channel transistors and the first pair of P-channel transistors at 1206, providing cross-coupled gate connections between the pair of N-channel transistors and second pair of P-channel transistors at 1208, providing DIGIT and DIGIT* connections between the first and second pairs of P-channel transistors at 1210, and providing LIMIT connections to the gates of the second pair of P-channel transistors at 1212.

Figure 13:
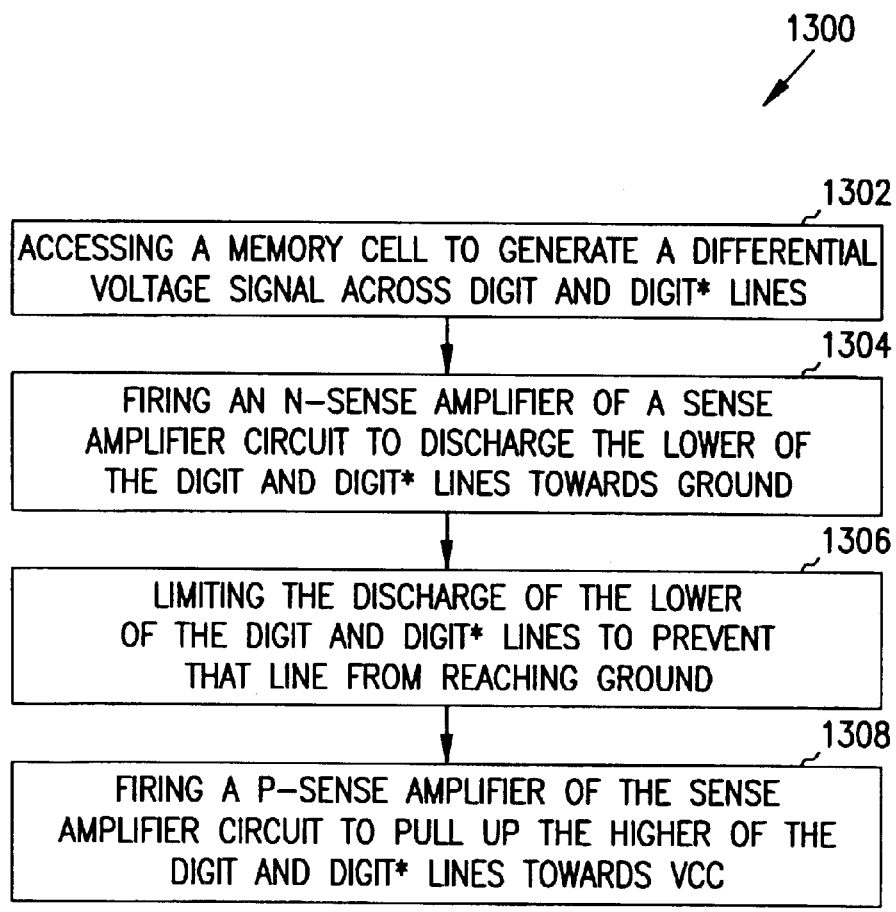
FIG. 13 is a flow diagram illustrating a method of sensing a memory cell in a memory circuit in accordance with one embodiment of the present invention.

Referring to FIG. 13, a method 1300 for sensing a memory cell in a memory circuit includes accessing a memory cell to generate a differential voltage signal across DIGIT and DIGIT* lines at 1302, firing an N-sense amplifier of a sense amplifier circuit to discharge the lower of the DIGIT and DIGIT* lines towards ground at 1304, limiting the discharge of the lower of the DIGIT and DIGIT* lines to prevent that line from reaching ground at 1306, and firing a P-sense amplifier of the sense amplifier circuit to pull up the higher of the DIGIT and DIGIT* lines towards Vcc. In one embodiment, the memory circuit is memory circuit 602, the differential voltage is generated across DIGIT and DIGIT* lines 726A and 726B, the N-sense amplifier is amplifier 802, and the P-sense amplifier is amplifier 804. In this embodiment, the accessing includes firing a word line for the memory cell being accessed to turn on an access transistor for that memory cell, which couples a storage capacitor for that memory cell to one of the pair of digit lines, the firing includes bringing an N-sense amplifier control signal coupled to the N-sense amplifier towards ground, and the limiting includes turning off a P-channel transistor coupled between a node of the N-sense amplifier and the lower digit line.

CONCLUSION

The above description and the accompanying drawings are intended to be illustrative, and not restrictive. Many other embodiments will be apparent to those of ordinary skill in the art upon reviewing the above description. The scope of the present invention should therefore be determined with reference to the appended claims, along with the full scope of equivalents to which such claims are entitled.

What is claimed is:

1. A sense amplifier circuit, comprising:
   an N-sense amplifier connected a first digit line and a second digit line;
   a P-sense amplifier connected the first digit line and the second digit line; and
   a limit circuit connected to the N-sense amplifier and the P-sense amplifier and operable for limiting the lowest voltage on the first digit line during an access cycle to a non-zero voltage.

2. The sense amplifier according to claim 1 wherein the limit circuit limits the lowest voltage on the first digit line to one transistor threshold voltage ($V_{TH}$) above zero volts.

3. The sense amplifier according to claim 2 wherein the limit circuit limits the lowest voltage on the first digit line to one P-channel transistor threshold voltage ($V_{TH}$) above zero volts.

4. The sense amplifier according to claim 1 wherein the limit circuit is further operable for driving the lowest voltage on the first digit line during an equilibrate cycle to zero voltages.

5. A sense amplifier circuit for limiting leakage in non-selected memory cells on a selected digit line, comprising:
   an N-sense amplifier;
   a P-sense amplifier connected to a first digit line and a second digit line;

a first transistor connected between the N-sense amplifier and the first digit line;

a second transistor connected between the N-sense amplifier and the second digit line; and a limit circuit connected to the first transistor and the second transistor and operable for limiting the lowest voltage on the first digit line to a non-zero voltage during an access cycle.

6. The sense amplifier according to claim 5 wherein the limit circuit limits the lowest voltage on the first digit line to one transistor threshold voltage ($V_{TH}$) above zero volts while the second digit line is at a supply voltage.

7. The sense amplifier according to claim 5 wherein the limit circuit is further operable for driving the lowest voltage on the first digit line during an equilibrate cycle to zero volts to produce a one half supply voltage on the first and second digit lines.

8. A sense amplifier circuit for limiting leakage in non-selected memory cells on a selected digit line, comprising:

an N-sense amplifier;

a P-sense amplifier connected to a first digit line and a second digit line;

a first transistor connected between the N-sense amplifier and the first digit line;

a second transistor connected between the N-sense amplifier and the second digit line; and a limit signal connected to the first transistor and the second transistor, the limit signal being zero volts to limit the lowest voltage on the first digit line to one transistor threshold voltage ($V_{TH}$) above zero volts during an access cycle, and the limit signal being a negative voltage to force the first digit line to zero volts during an equilibrate cycle.

9. The sense amplifier according to claim 8 wherein the first transistor and the second transistor are p-channel transistors and the one transistor threshold voltage ($V_{TH}$) is one p-channel transistor threshold voltage.

10. A DRAM sense amplifier circuit for limiting access transistor leakage on non-selected memory cells on a digit line shared with an accessed memory cell, comprising:

a cross-coupled N-sense amplifier;

a cross-coupled P-sense amplifier connected to a true digit line and a complement digit line;

a first p-channel transistor connected between the N-sense amplifier and the true digit line;

a second transistor connected between the N-sense amplifier and the complement digit line; and a limit signal connected to the first transistor and the second transistor and operable for limiting the lowest voltage on the true digit line or the complement digit line to a non-zero voltage during an access cycle.

11. The sense amplifier according to claim 10 wherein the lowest voltage on the true digit line or the complement digit line is one transistor threshold voltage above zero volts.

12. The sense amplifier according to claim 11 wherein the highest voltage on the true digit line or the complement digit line is the supply voltage ($V_{CC}$).

13. The sense amplifier according to claim 10 wherein the limit signal is a negative voltage to force the true digit line and the complement digit line to $V_{CC}/2$ during an equilibrate cycle.

14. A DRAM memory device, comprising:

a plurality of 1T1C (one transistor, one capacitor) memory cells sharing a common digit line and having separate wordlines;

a sense amplifier connected to the common digit line, and having an N-sense amplifier connected to the digit line and to a reference digit line and a P-sense amplifier connected the digit line and the reference digit line; and a limit circuit connected to the sense amplifier and operable for limiting the lowest voltage on the digit line to a non-zero voltage during an access cycle.

15. The memory device according to claim 14 wherein the lowest voltage on the digit line is one transistor threshold voltage above zero volts.

16. The memory device according to claim 15 wherein the highest voltage on the digit line is the supply voltage ($V_{CC}$).

17. The memory device according to claim 16 wherein the limit circuit is further operable for forcing the digit line and the reference digit line to $V_{CC}/2$ during an equilibrate cycle.

18. A DRAM sense amplifier circuit for limiting access transistor leakage on non-selected memory cells on a digit line shared with an accessed memory cell, comprising:

an N-sense amplifier connected a first digit line and a second digit line;

a P-sense amplifier connected the first digit line and the second digit line; and a limit signal connected to the N-sense amplifier and the P-sense amplifier, the limit signal being zero volts to limit the lowest voltage on the first digit line to one transistor threshold voltage ($V_{TH}$) above zero volts during an access cycle, and the limit signal being a negative voltage to force the first digit line to zero volts during an equilibrate cycle.

19. A DRAM sense amplifier circuit for limiting access transistor leakage on non-selected memory cells on a digit line shared with an accessed memory cell, comprising:

an N-sense amplifier;

a P-sense amplifier connected the first digit line and the second digit line; and a first transistor connected between the N-sense amplifier and the first digit line;

a second transistor connected between the N-sense amplifier and the second digit line; and a limit signal connected to the first transistor and the second transistor, the limit signal being zero volts ($V_{SS}$) to limit the lowest voltage on the first digit line to one transistor threshold voltage ($V_{TH}$) above zero volts during an access cycle.

20. The sense amplifier according to claim 19 wherein the limit signal is a negative voltage ($V_{BB}$) to force the first digit line to zero volts during an equilibrate cycle.

21. A DRAM sense amplifier circuit, comprising:

a cross-coupled N-sense amplifier having a first cross-coupling node and a second cross-coupling node;

a cross-coupled P-sense amplifier connected to a true digit line and a complement digit line and cross coupled with the first cross-coupling node and the second cross-coupling node of the N-sense amplifier;

a first limit transistor connected between the first cross-coupling node of the N-sense amplifier and the true digit line;

a second limit transistor connected between the second cross-coupling node of the N-sense amplifier and the complement digit line; and a limit signal connected to the first limit transistor and the second limit transistor and operable for limiting the lowest voltage on the true digit line or the complement digit line to a non-zero voltage during an access cycle.

22. The sense amplifier according to claim 21 wherein the limit signal is zero volts to limit the lowest voltage on the true digit line or the complement digit line to one transistor threshold voltage ($V_{TH}$) above zero volts during an access cycle.

23. The sense amplifier according to claim 21 wherein the limit signal is a negative voltage to force the true digit line and the complement digit line to one-half the supply voltage ($V_{CC}/2$) during an equilibrate cycle.

24. A DRAM sense amplifier, comprising:
   a true digit line (726A) and a complement digit line (726B);
   a first transistor (816A) having a first source/drain node connected to a first sense amplifier control input (PSA), having a second source/drain node (818A) connected to the true digit line, and having a gate connected to a second internal node (812B);
   a second transistor (816B) having a first source/drain node connected to the first sense amplifier control input (PSA), having a second source/drain node connected to the complement digit line, and having a gate connected to a first internal node (812A);
   a third transistor (810A) having a first source/drain node connected to a second sense amplifier control input (NSA), having a second source/drain node connected to the first internal node (812A), and having a gate connected to the second internal node (812B);
   a fourth transistor (810B) having a first source/drain node connected to the second sense amplifier control input (NSA), having a second source/drain node connected to the second internal node (812B), and having a gate connected to the first internal node (812A);
   a fifth transistor (806) having a first source/drain node connected to the true digit line (818A), having a second source/drain node connected to the first internal node (812A), and having a gate connected to a limit signal (822);
   a sixth transistor (808) having a first source/drain node connected to the complement digit line (818B), having a second source/drain node connected to the second internal node (812B), and having a gate connected to the limit signal (822); and
   a limit generation circuit for generating the limit signal.

25. The DRAM sense amplifier of claim 24 wherein the limit signal is zero volts during an access cycle, and the limit signal is less than zero volts during an equilibrate cycle.

26. The DRAM sense amplifier of claim 24 wherein the limit signal is zero volts to limit the lowest voltage on the first digit line to one transistor threshold voltage ($V_{TH}$) above zero volts during an access cycle, and the limit signal being a negative voltage ($V_{BB}$) to force the first digit line to zero volts during an equilibrate cycle.

27. A method of sensing a memory cell in a memory circuit, comprising:
   accessing a memory cell to generate a differential voltage signal between a true digit line and a complement digit line;
   forcing the true digit line to the supply voltage; and
   limiting the complement digit line to a non-zero voltage.

28. The method according to claim 27 wherein limiting includes limiting the complement digit line on one transistor threshold voltage above zero volts to limit access transistor leakage from non-selected memory cells on a selected digit line.

29. A method of operating a memory cell in a memory circuit, comprising:
   equilibrating the true digit line and the compliment digit line to VCC/2;
   accessing a memory cell to generate a differential voltage signal between a true digit line and a complement digit line;
   forcing the true digit line to the supply voltage; and
   limiting the complement digit line to a non-zero voltage.

30. A method of sensing a memory cell in a memory circuit while limiting access transistor leakage from non-selected memory cells on a selected digit line, comprising:
   sensing the differential voltage signal between a selected digit line and a non-selected digit line using a sense amplifier circuit which includes an N-sense amplifier and a P-sense amplifier, wherein the sensing includes:
      firing the N-sense amplifier to discharge the low voltage on the true digit line towards ground;
      firing the P-sense amplifier to charge the higher voltage on the complement digit line toward the supply voltage; and
      limiting the discharge of the low voltage on the true digit line to prevent the low voltage digit line from reaching ground.

31. The method according to claim 30 wherein limiting includes limiting the low voltage on the true digit line on one transistor threshold voltage above zero volts to limit access transistor leakage from non-selected memory cells on a selected digit line.

* * * * *